(12) United States Patent
Doorn

(10) Patent No.: US 6,580,865 B1
(45) Date of Patent: Jun. 17, 2003

(54) OPTICAL FIBER SYSTEMS

(75) Inventor: Schelto Van Doorn, San Jose, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/586,716

(22) Filed: Jun. 5, 2000

(51) Int. Cl.[7] .............................................. G02B 6/00
(52) U.S. Cl. ...................................... 385/134; 385/135
(58) Field of Search ................................ 385/135, 134, 385/88, 144, 14, 94, 92, 89, 49, 90, 159; 350/96.16, 96.15, 96.22, 24

(56) References Cited

U.S. PATENT DOCUMENTS

| | | | |
|---|---|---|---|
| 4,406,514 A | | 9/1983 | Hillegonds et al. |
| 4,732,446 A | * | 3/1988 | Gipson et al. ............ 350/96.18 |
| 4,881,792 A | | 11/1989 | Alameel et al. |
| 4,895,424 A | * | 1/1990 | Hughes ...................... 350/96.2 |
| 4,913,508 A | | 4/1990 | Blyer, Jr. et al. |
| 4,943,136 A | * | 7/1990 | Popoff ...................... 350/96.16 |
| 5,023,463 A | * | 6/1991 | Boardman et al. .......... 250/551 |
| 5,134,679 A | | 7/1992 | Robin et al. |
| 5,155,786 A | * | 10/1992 | Ecker et al. ................... 385/94 |
| 5,283,851 A | * | 2/1994 | Vergnolle .................... 385/134 |
| 5,325,454 A | * | 6/1994 | Rittle et al. ..................... 385/88 |
| 5,764,834 A | * | 6/1998 | Huttermans .................. 385/60 |
| 5,793,919 A | | 8/1998 | Payne et al. |
| 5,980,312 A | | 11/1999 | Chapman et al. |
| 6,038,355 A | * | 3/2000 | Bishop ......................... 385/14 |

FOREIGN PATENT DOCUMENTS

| | | |
|---|---|---|
| EP | 0860721 | 8/1998 |
| JP | 10239535 | 11/1998 |
| JP | 10339818 | 12/1998 |
| JP | 11133251 | 5/1999 |
| WO | WO 98/40774 | 9/1998 |

OTHER PUBLICATIONS

Mitachi et al., "Trend in the Technology and Prospects for Reducing the Cost for Fiber Optic Connectors", Mar. 1, 1997, NTT Review, Telecommunications Association, Tokyo, Japan, XP000687067.

Pluris, "Competitive Study: Analyzing the Options for Scalable Multi–Terabit Routing From the Edge to the Core," (Apr. 1999).

Pluris, "Pluris 2000 Data Sheet," (1999).

Pluris, "The Next Generation Internet Infrastructure," (1998).

\* cited by examiner

*Primary Examiner*—Jean F. Duverne
(74) *Attorney, Agent, or Firm*—Fish & Richardson P.C.

(57) ABSTRACT

An optical fiber system that enables direct board-to-board optical communication is described. The optical fiber system does not require data transmission through the backplane and, consequently, avoids the complexity and possible communication delays that would be required if data transmissions had to go through the backplane. The optical fiber system includes a positioner that is configured to urge opposite ends of two or more optical fibers respectively toward opposed optical devices that are coupled to facing sides of adjacent printed circuit boards coupled to a common backplane. The optical fiber system may be installed and removed quickly and easily, and may be readily retrofitted into existing computer systems.

45 Claims, 5 Drawing Sheets

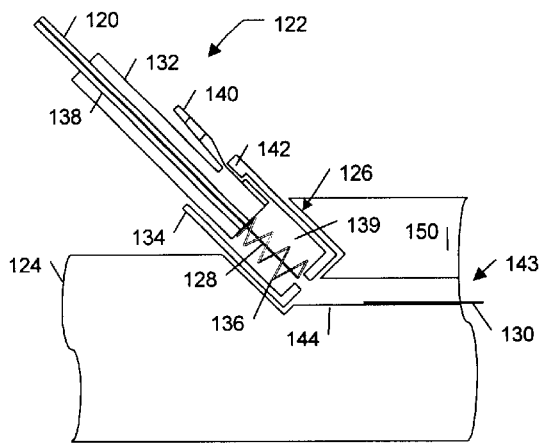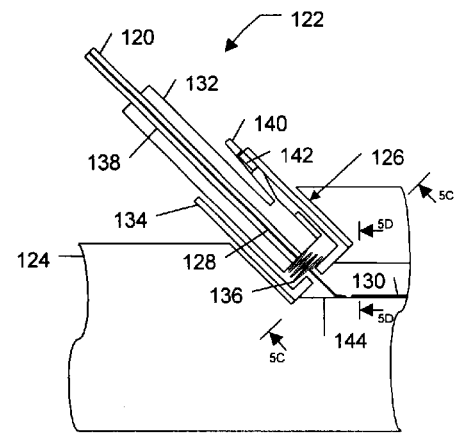
FIG. 5A                              FIG. 5B
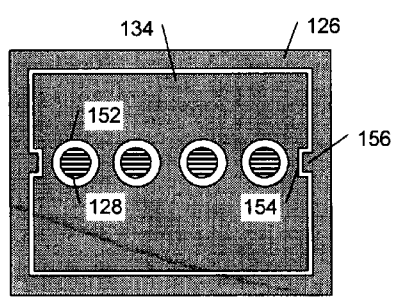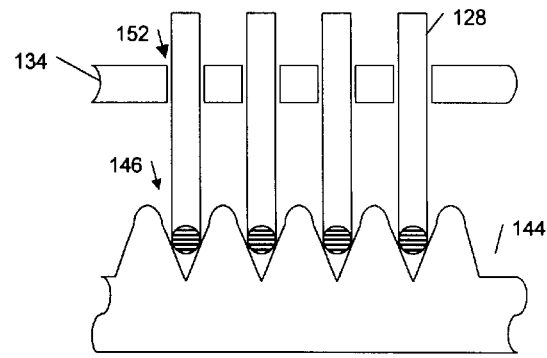
FIG. 5C                              FIG. 5D

OPTICAL FIBER SYSTEMS

TECHNICAL FIELD

This invention relates to fiber optic connectors and optical fiber systems.

BACKGROUND

Fiber optic connectors couple optical communication channels (e.g., optical fibers) to one or more optical devices (e.g., electro-optic and opto-electric devices). The optical communication channels may be defined by a bundle of glass or plastic fibers (a "fiber optic cable"), each of which is capable of transmitting data independently of the other fibers. Relative to traditional metal connections, optical fibers have a much greater bandwidth, they are less susceptible to interference, and they are much thinner and lighter. Because of these advantageous physical and data transmission properties, efforts have been made to integrate fiber optics into computer system designs. For example, in a local area network, fiber optics may be used to connect a plurality of local computers to each other and to centralized equipment, such as servers and printers. In this arrangement, each local computer has an optical transceiver for transmitting and receiving optical information. The optical transceiver may be mounted on a printed circuit board that supports one or more integrated circuits. Typically, each computer includes several printed circuit boards that are plugged into the sockets of a common backplane. The backplane may be active (i.e., it includes logic circuitry for performing computing functions) or it may be passive (i.e., it does not include any logic circuitry). An external network fiber optic cable may be connected to the optical transceiver through a fiber optic connector that is coupled to the backplane.

Other fiber optic applications have been proposed. For example, backplanes have been designed to interconnect the circuit boards of a computer system and thereby enable optical communication between the boards (see, e.g., U.S. Pat. Nos. 4,913,508, 5,134,679, and 5,793,919). These backplanes often are referred to as "optical backplanes." Typically, an optical backplane includes one or more fiber optic cables that couple to connectors mounted on the edges of the printed circuit boards.

SUMMARY

The invention features an optical fiber system that enables direct board-to-board optical communication that does not require data transmission through the backplane. In accordance with this inventive optical fiber system, a positioner is configured to urge opposite ends of two or more optical fibers respectively toward opposed optical devices that are coupled to facing sides of adjacent printed circuit boards coupled to a common backplane.

Embodiments may include one or more of the following features.

The positioner may be configured to support the optical fibers along a curved path between the opposed optical devices. The ends of the optical fibers preferably extend beyond respective ends of the positioner. The positioner preferably is configured to hold the optical fibers in a spaced-apart, substantially parallel planar array. The positioner may be configured to align end portions of the optical fibers in directions oriented at oblique angles relative to respective engagement surfaces of the opposed optical devices.

In one embodiment, the positioner includes a flexible and resilient support structure that extends along a substantial length of the optical fibers. The support structure preferably includes a flexible and resilient ribbon matrix. The ribbon matrix may incorporate an elongated resilient member that increases the resiliency of the ribbon matrix. The positioner and the optical fibers preferably form a unitary, elongated fiber optic ribbon having a planar surface bounded by two ends and two sides. The ends of the optical fibers preferably extend beyond respective ends of the fiber optic ribbon. The fiber optic ribbon may preferentially bends in a plane orthogonal to the planar surface upon application of a compressive force between the ends of the fiber optic ribbon. The fiber optic ribbon preferably is elastically bendable.

In another embodiment, the optical fibers are incorporated in a multi-fiber fiber optic cable and the positioner is configured to releasably receive the multi-fiber fiber optic cable. The positioner preferably has a support arm configured to guide the optical fibers into alignment with the opposed optical devices. The support arm may include two or more support fingers. The positioner may include a second support arm with two or more support fingers that interleave with the support fingers of the first support arm. The positioner preferably is pivotally coupled to each of the opposed optical devices.

The positioner may be characterized by an engaged configuration in which the optical fibers are optically coupled to the opposed optical devices and a disengaged configuration in which the optical fibers are optically de-coupled from the opposed optical devices. The positioner may include a biasing mechanism configured to switch the positioner between the engaged configuration and the disengaged configuration upon application of a centralized pressing force. The biasing mechanism preferably includes a spring coupled between the positioner and one of the opposed optical devices.

Among the advantages of the invention are the following. The invention provides an optical fiber system that enables direct board-to-board optical communication without the complexity and possible communication delays that would be required if data transmissions had to go through the backplane. In addition, each inventive optical fiber system may be installed and removed quickly and easily. Furthermore, the invention may be readily retrofitted into existing computer systems.

Other features and advantages of the invention will become apparent from the following description, including the drawings and the claims.

DESCRIPTION OF DRAWINGS

FIG. 5A is a diagrammatic cross-sectional side view of a retracted fiber optic plug positioned in a socket of an optical device.

FIG. 5B is a diagrammatic cross-sectional side view of the fiber optic plug of FIG. 5A in an extended configuration.

FIG. 5C is a cross-sectional front view of the extended fiber optic plug of FIG. 5B positioned inside the socket.

FIG. 5D is a diagrammatic cross-sectional front view of the optical device of FIG. 5B receiving the optical fibers from the extended fiber optic plug.

DETAILED DESCRIPTION

Figure 1:
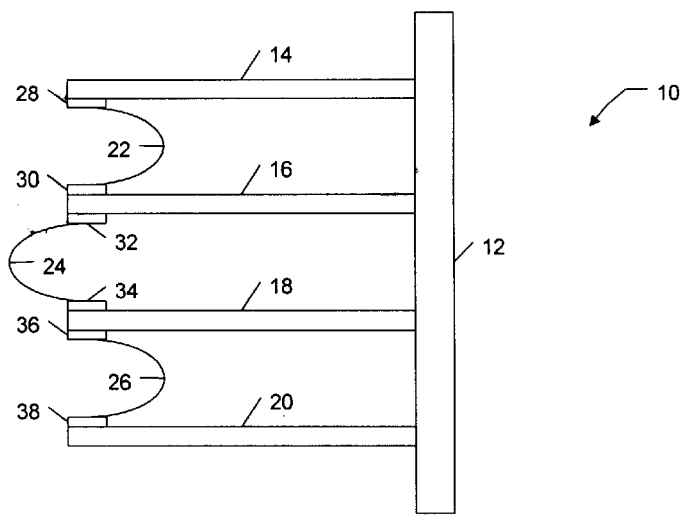
FIG. 1 is a diagrammatic side view of a computer system that includes a backplane and four printed circuit boards coupled by respective optical fiber systems.

Referring to FIG. 1, a computer system 10 includes a backplane 12 into which printed circuit boards 14, 16, 18 and 20 are plugged. Optical fiber systems 22, 24 and 26 optically couple printed circuit boards 14–20. Each of the printed circuit boards 14–20 supports one or more integrated circuits and at least one optical device 28, 30, 32, 34, 36, 38 (e.g., a fiber optic transceiver) for transmitting and receiving optical data signals over optical fiber systems 22–26. Each of the optical fiber systems 22–26 includes a fiber optic positioner that is configured to urge opposite ends of a multi-fiber fiber optic cable respectively toward a pair of opposed optical devices that are mounted on facing sides of a pair of adjacent printed circuit boards. By this arrangement, optical fiber systems 22–26 enable direct board-to-board optical communication without requiring data transmission through backplane 12.

The components (e.g., the integrated circuits and the optical devices) supported on the printed circuit boards may be housed in ball grid array (BGA) packages that include die carriers with bottom surfaces supporting a plurality of solder balls (or bumps) that connect to contacts on the surfaces of the printed circuit boards. The BGA packages may include an over molded pad array carrier or a ceramic substrate material that houses the printed circuit board components. In alternative embodiments, the printed circuit board components may be mounted to the printed circuit boards using surface mount technology (SMT) or other mounting technique (e.g., bore soldering or pin through-hole technology). In other embodiments, the integrated circuits and optical devices 28–38 may be mounted on single-sided printed circuit boards rather than two-sided printed circuit boards 14–20.

Figure 2A:
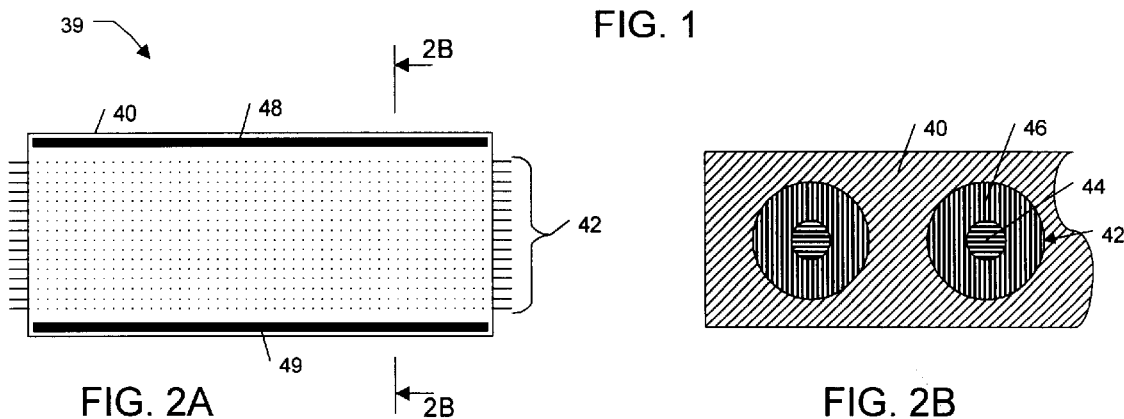
FIG. 2A is a diagrammatic top view of an optical fiber system with an integral positioner in a disengaged configuration.
Figure 2B:
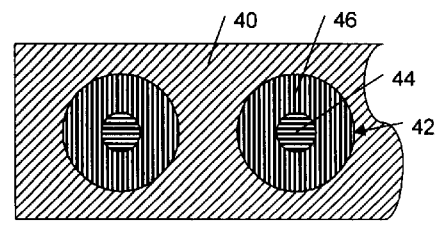
FIG. 2B is a diagrammatic cross-sectional front view of the optical fiber system of FIG. 2A.
Figure 2C:
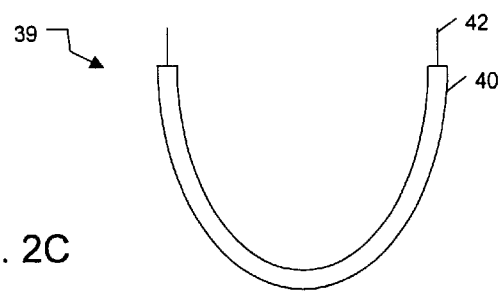
FIG. 2C is a diagrammatic side view of the optical fiber system of FIG. 2A with the positioner in an engaged configuration.

Referring to FIGS. 2A–2C, in one optical fiber system 39, a positioner 40 is a flexible and resilient ribbon matrix that may be formed from, for example, a UV curable acrylate material or other thermoplastic material (e.g., polyvinyl chloride). Positioner 40 encases and holds two or more optical fibers 42 in a spaced-apart, substantially parallel planar array. The optical fibers 42 may be spaced apart by a distance of about 100 μm to about 1,000 μm. As shown in FIG. 2B, each optical fiber 42 includes a core 44 and a cladding 46. The ends of optical fibers 42 extend beyond positioner 40 so that they may be coupled to an opposed pair of optical devices. In one embodiment, optical fibers 42 extend beyond the ends of positioner 40 by a distance of about 0.5 cm to about 3 cm. The fiber end faces may be flat or angled; if they are angled, however, optical fibers 42 should be oriented in a way that is complementary to the orientation of the input fibers of positioner 40. In this embodiment, positioner 40 and optical fibers 42 form a unitary fiber optic ribbon cable with sixteen optical communication channels. Other embodiments may include a different number of optical fibers (e.g., 2, 4, 16, 32, 64 or 128 optical fibers).

Referring to FIG. 2C, positioner 40 is sufficiently flexible that it can be bent elastically into a curved shape that enables the ends of optical fibers 42 to engage a pair of opposed optical devices. At the same time, the ribbon matrix is sufficiently resilient that it generates an outward restoring force that tends to return optical fiber system 39 back to its original planar shape (FIG. 2A). This restoring force causes positioner 40 to clamp the ends of optical fibers 42 to the optical inputs of the opposed optical devices. Additional materials may be incorporated into the ribbon matrix to increase its resiliency. For example, one or more resilient wires 48 formed from, for example, metal or plastic, may be embedded along the length of the ribbon matrix to increase the restoring force generated by positioner 40.

In operation, a technician may apply a compressive force between the ends of positioner 40 to cause it to bend into the U-shaped curve shown in FIG. 2C. Because of the elongated planar shape of the ribbon matrix, positioner 40 preferentially bends in a plane that is parallel to optical fibers 42 and orthogonal to the planar surface of the ribbon matrix. Once the ends of the ribbon matrix have been bent together close enough, the technician may insert optical fiber system 39 between a pair of opposed optical devices and, subsequently, reduce the applied compressive force until optical fiber system 39 engages the opposed optical devices. As shown in FIG. 1, the U-shaped optical fiber system 39 may be inserted between the pair of opposed optical devices so that it extends between the corresponding pair of adjacent printed circuit boards (e.g., optical fiber systems 22 and 26) or extend outside of the region between the printed circuit boards (e.g., optical fiber system 24).

Figure 3A:
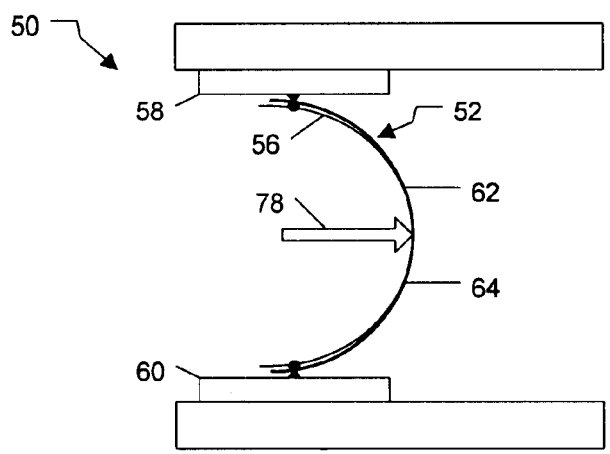
FIG. 3A is an enlarged diagrammatic side view of two printed circuit boards, an optical fiber system, and a fiber optic positioner in a disengaged configuration.
Figure 3B:
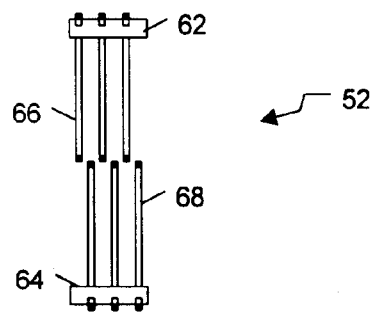
FIGS. 3B and 3C are a diagrammatic top view and an enlarged diagrammatic side view of the disengaged positioner of FIG. 3A, respectively.
Figure 3C:
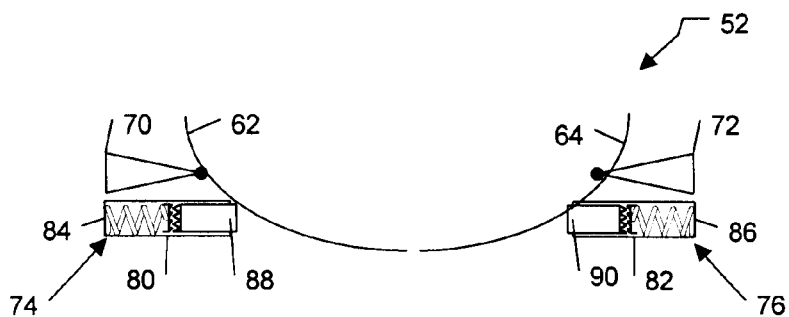
Figure 3D:
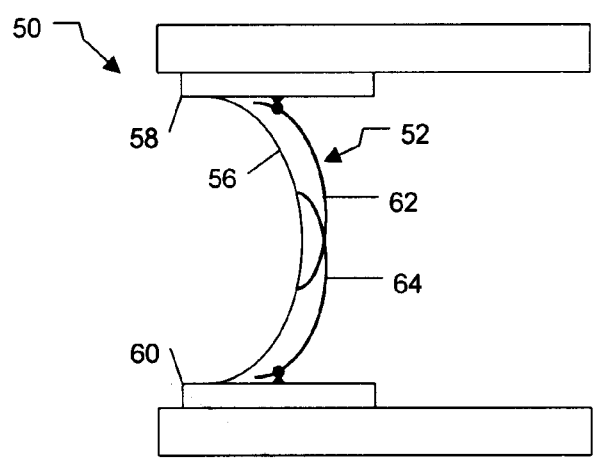
FIG. 3D is an enlarged diagrammatic side view of the two printed circuit boards coupled by the optical fiber system of FIG. 3A, with the positioner in an engaged configuration.
Figure 3E:
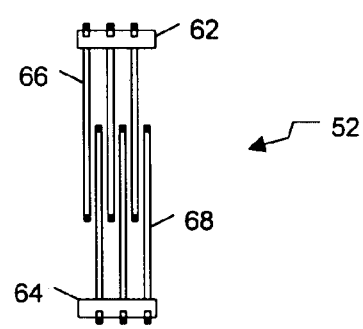
FIGS. 3E and 3F are a diagrammatic top view and an enlarged diagrammatic side view of the engaged positioner of FIG. 3D, respectively.
Figure 3F:
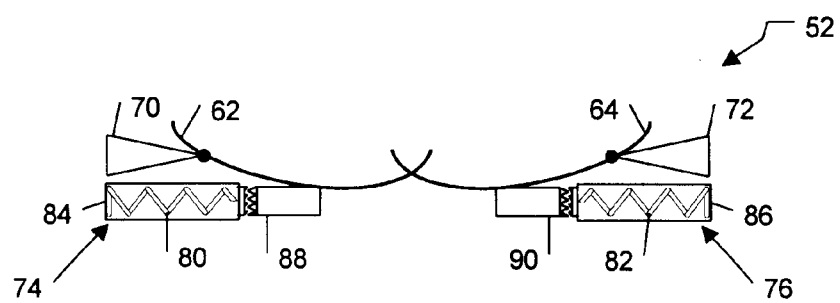

Referring to FIGS. 3A–3F, in another optical fiber system 50, a positioner 52 is configured to releasably receive a multi-fiber fiber optic ribbon cable 56 (FIG. 3A) and bias it into engagement with a pair of opposed optical devices 58 and 60 (FIG. 3D). The fibers of ribbon cable 56 extend beyond the surrounding support matrix so that they may be coupled to optical devices 58, 60. The optical fibers may extend beyond the support matrix by a distance of about 0.5 cm to about 3 cm.

Positioner 52 includes a pair of cantilevered support arms 62, 64 respectively coupled to a plurality of distal support fingers 66, 68. Support fingers 66, 68 are interleaved when positioner 52 is in the engaged configuration (FIGS. 3E and 3F) and they are almost end-to-end when positioner 52 is in the disengaged configuration (FIGS. 3B and 3C). Support fingers 66, 68 include rails (not shown) for guiding multi-fiber fiber optic cable 56 into proper alignment with optical devices 58, 60. Positioner 52 is pivotally mounted to support structures 70, 72, which are coupled to optical devices 58, 60. Dual-position pistons 74, 76 are mounted to optical devices 58, 60 and are operable to switch positioner 52 between the engaged configuration and the disengaged configuration upon application of a pressing force 78 to a central portion of positioner 52. Pistons 74, 76 include springs 80, 82 respectively coupled between cylindrical housings 84, 86 and caps 88, 90. Each piston 74, 76 operates, for example, like a convention ballpoint pen, and includes a locking mechanism that causes caps 88, 90 to engage inner surfaces of housings 84, 86 every other time a sufficient pressing force 78 is applied.

In operation, a technician may set positioner 52 into the disengaged configuration and load multi-fiber fiber optic ribbon cable 56 onto positioner 52 (FIG. 3A). At this time, caps 88, 90 are locked, springs 80, 82 are compressed within housings 84, 86 and support arms 62, 64 are locked in the disengaged configuration. After the ribbon cable has been seated properly on positioner 52, the technician may apply a simple pressing force 78 to a centralized portion of the positioner to connect the ribbon cable to optical devices 58, 60. In response to the pressing force, caps 88, 90 unlock and the restoring forces of springs 80, 82 bias support arms 62, 64 into the engaged configuration.

In each of the above-described embodiments, the fiber optic positioners are configured to urge opposite ends of a multi-fiber fiber optic cable respectively toward a pair of opposed optical devices. As explained in detail below, the fiber optic positioners also are configured to guide a multi-fiber fiber optic cable into proper alignment with the pair of opposed optical devices.

Figure 4A:
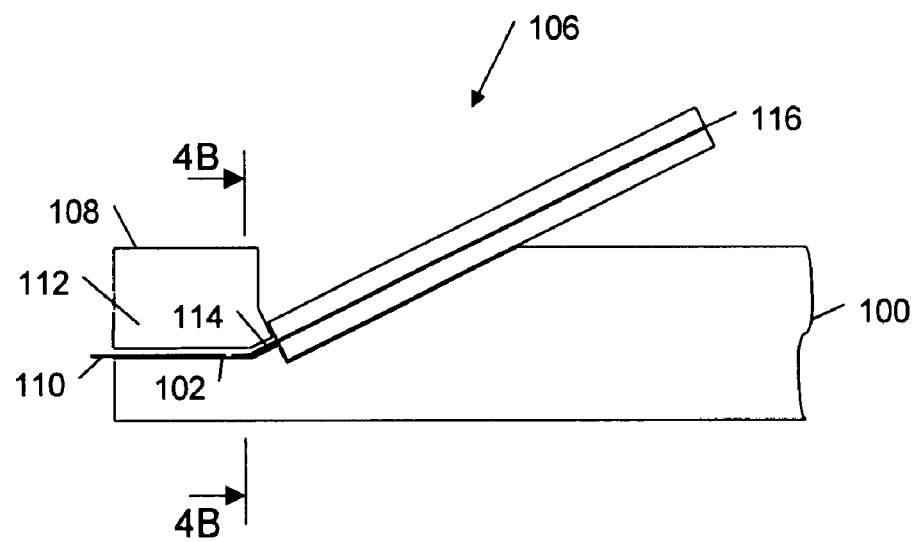
FIG. 4A is a diagrammatic cross-sectional side view of an optical device with a plurality of grooves receiving the fibers of a multi-fiber fiber optic cable.
Figure 4B:
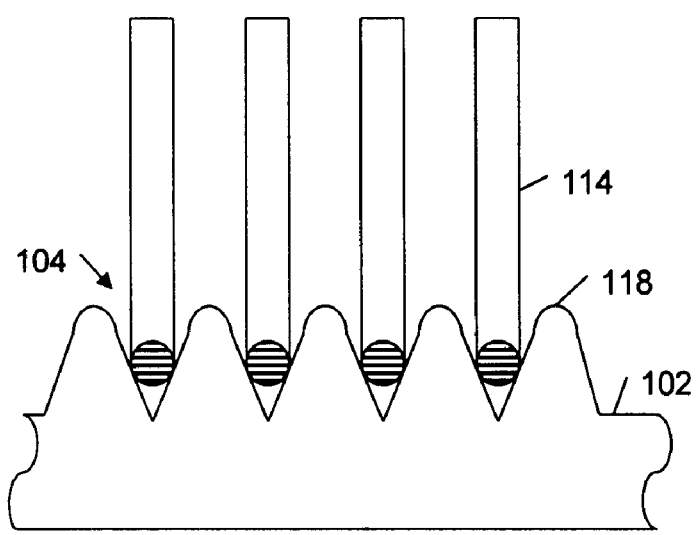
FIG. 4B is a diagrammatic cross-sectional front view of the optical device of FIG. 4A receiving the fibers of the multi-fiber fiber optic cable.

Referring to FIGS. 4A and 4B, in one embodiment, an optical device 100 includes a fiber-supporting surface 102 with a plurality of fiber-receiving grooves 104 and an optical input 106 formed from a fiber guide 108 and a plurality of input optical fibers 110. Fiber guide 108 and fiber-supporting surface 102 may be formed in the over molded pad array carrier (or the ceramic substrate material) that houses optical device 100. Fiber guide 108 has a plurality of bores 112 that retain input fibers 110 and align them with grooves 104. Input fibers 110 may be secured in bores 112 by, for example, an adhesive. In this embodiment, input fibers 110 are substantially straight. In another embodiment, input fibers 110 may be oriented at an oblique angle relative to fiber-supporting surface 102 and, as a result, input fibers 110 would bend or bow resiliently in the regions where they contact fiber-supporting surface 102. In the engaged configuration, one of the above-described positioners aligns and guides the coupling fibers 114 of the multi-fiber fiber optic cable 116 into grooves 104 at an oblique angle relative to fiber-supporting surface 102 (FIG. 4A). Coupling fibers 114 resiliently bend or bow in the regions where they contact fiber-supporting surface 102. In the engaged configuration, the distal ends of coupling fibers 114 abut the distal ends of input fibers 110 to optically couple the multi-fiber fiber optic cable 116 to optical device 100. By this arrangement, slight differences in the lengths of the coupling fibers 114 may be accommodated by changes in the locations where input fibers 110 bend at fiber-supporting surface 102. In an alternative embodiment, coupling fibers 114 may abut directly against an active optical device positioned in bore 112.

In this embodiment, grooves 104 are defined by pairs of adjacent side walls 118 that taper in width as they extend away from surface 102. To accommodate an optical fiber spacing of about 250 μm, side walls 118 may have a base width of about 125 μm and a groove width at surface 102 of about 125 μm.

Referring to FIGS. 5A–5D, in another embodiment, the terminal portion of a multi-fiber fiber optic cable 120 includes a fiber-aligning plug 122, and the over molded pad array carrier (or the ceramic substrate material) that houses an optical device 124 incorporates a mating socket 126. Socket 126 is configured to receive plug 122 and to align and guide the coupling fibers 128 of fiber optic cable 120 into optical contact with the input fibers 130 of optical device 124.

Plug 122 includes a plug body 132, a plug cap 134 which is slidable within plug body 132, and a spring 136 that is coupled between plug body 132 and plug cap 134. Plug body 132 includes a bore 138 through which optical fiber cable 120 extends. Fiber optic cable 120 may be secured within bore 138 by, for example, an adhesive. The distal portions of coupling fibers 128 extend beyond the distal end of plug body 132 and into a cavity 139 defined by plug cap 134. Plug 122 is characterized by a retracted configuration in which the distal portions of coupling fibers 128 are contained in plug cap 134 (FIG. 5A), and an extended configuration in which the distal portions of coupling fibers 128 extend beyond plug cap 134 (FIG. 5B). Plug body 132 includes a latch 140 that catches on a lug 142 of plug cap 134 to lock plug 122 in the extended configuration; latch 140 may be depressed to release plug cap 134 from plug body 132, whereby spring 136 biases plug cap 134 away from plug body 132. Plug 122 and socket 126 also may include a similar locking mechanism (not shown) to secure plug 122 to socket 126.

Plug socket 126 includes a fiber guide 143 and a fiber-supporting surface 144 with a plurality of fiber-receiving grooves 146. Fiber guide 143 and fiber-supporting surface 144 may be formed in the over molded pad array carrier (or the ceramic substrate material) that houses optical device 124. Fiber guide 143 has a plurality of bores 150 that hold input fibers 130 and align them with grooves 146. Input fibers 130 may be secured in bores 150 by, for example, an adhesive. In this embodiment, input fibers 130 are substantially straight. In another embodiment, input fibers 130 may be oriented at an oblique angle relative to fiber-supporting surface 144 and, as a result, input fibers 130 would bend or bow resiliently in the regions where they contact fiber-supporting surface 144.

As shown in FIG. 5C, plug cap 134 includes a plurality of fiber-aligning openings 152 through which coupling fibers 128 extend when plug 122 is in the extended configuration. Plug cap 134 also includes a pair of slots 154 that ride along a pair of alignment rails 156 formed in socket 126. Plug 122 may be inserted within socket 126 and locked in the extended configuration by compressing spring 136 until latch 140 catches lug 142. In this position, coupling fibers 128 extend out of openings 152 in plug cap 134 toward fiber supporting socket surface 144. As shown in FIG. 5D, openings 152 align and guide coupling fibers 128 into grooves 146. Coupling fibers 128 are oriented at an oblique angle relative to fiber-supporting surface 144 and, as a result, coupling fibers 128 resiliently bend or bow in the regions where they contact fiber-supporting surface 144. The distal ends of coupling fibers 128 abut the distal ends of input fibers 130 to optically couple multi-fiber fiber optic cable 120 to optical device 124. By this arrangement, slight differences in the lengths of the coupling fibers 128 may be accommodated by changes in the locations where input fibers 130 bend at fiber-supporting surface 144. In an alternative embodiment, coupling fibers 114 may abut directly against an active optical device positioned in bore 150.

Other embodiments are within the scope of the claims.

For example, the optical fiber receiving surfaces described above are configured to bend the received fibers at only one plane. As a result, the optical fibers form a "C-shape" near the region of contact between the optical fibers and the optical fiber receiving surface. In other embodiments, the optical fibers may be bent at two planes so that the optical fibers form an "S-shape."

The optical fibers also may be arranged in any of the above-described embodiments as a spaced-apart, three-dimensional array of substantially parallel fibers.

What is claimed is:

1. An optical fiber system, comprising:
   two or more optical fibers; and
   a flexible and resilient positioner extending substantially the length of the optical fibers configured to urge opposite ends of the two or more optical fibers respectively toward opposed optical devices coupled to facing sides of adjacent and substantially parallel printed circuit boards coupled to a common backplane.

2. The optical fiber system of claim 1, wherein the positioner is configured to support the optical fibers along a curved path between the opposed optical devices.

3. The optical fiber system of claim 1, wherein the ends of the optical fibers extend beyond respective ends of the positioner.

4. The optical fiber system of claim 1, wherein the support structure comprises a flexible and resilient ribbon matrix.

5. The optical fiber system of claim 4, wherein the ribbon matrix incorporates an elongated resilient member that increases the resiliency of the ribbon matrix.

6. The optical fiber system of claim 1, wherein the positioner and the optical fibers form a unitary, elongated fiber optic ribbon having a planar surface bounded by two ends and two sides.

7. The optical fiber system of claim 6, wherein the ends of the optical fibers extend beyond respective ends of the fiber optic ribbon.

8. The optical fiber system of claim 6, wherein the fiber optic ribbon preferentially bends in a plane orthogonal to the planar surface upon application of a compressive force between the ends of the fiber optic ribbon.

9. The optical fiber system of claim 6, wherein the fiber optic ribbon is elastically bendable.

10. The optical fiber system of claim 1, wherein the positioner is configured to hold the optical fibers in a spaced-apart, substantially parallel planar array.

11. The optical fiber system of claim 1, wherein the positioner is configured to align end portions of the optical fibers in directions oriented at oblique angles relative to respective engagement surfaces of the opposed optical devices.

12. An optical fiber system, comprising:
    two or more optical fibers incorporated in a multi-fiber fiber optic cable; and
    a positioner configured to:
      releasably receive the multi-fiber fiber optic cable, and
      in an engaged configuration, urge opposite ends of the optical fibers toward opposed optical devices coupled to facing sides of adjacent and substantially parallel printed circuit boards coupled to a common backplane, and guide the optical fibers into alignment with the opposed optical devices.

13. The optical fiber system of claim 12, wherein the positioner has a support arm configured to guide the optical fibers into alignment with the opposed optical devices.

14. The optical fiber system of claim 13, wherein the support arm includes two or more support fingers.

15. The optical fiber system of claim 14, wherein the positioner includes a second support arm with two or more support fingers that interleave with the support fingers of the first support arm.

16. The optical fiber system of claim 12, wherein the positioner is pivotally coupled to each of the opposed optical devices.

17. The optical fiber system of claim 12, wherein the positioner is characterized by an engaged configuration in which the optical fibers are optically coupled to the opposed optical devices and a disengaged configuration in which the optical fibers are optically de-coupled from the opposed optical devices.

18. The optical fiber system of claim 17, wherein the positioner includes a biasing mechanism configured to switch the positioner between the engaged configuration and the disengaged configuration upon application of a centralized pressing force.

19. The optical fiber system of claim 18, wherein the biasing mechanism includes a spring coupled between the positioner and one of the opposed optical devices.

20. A system for coupling printed circuit boards, the system comprising:
    a common backplane;
    a first and a second printed circuit board, the first and second printed circuits board adjacent and substantially parallel to one another and each coupled to the common backplane;
    a first optical device coupled to the first printed circuit board, the first optical device facing the second printed circuit board;
    a second optical device coupled to the second printed circuit board, the second optical device facing the first printed circuit board; and
    a positioner configured to urge opposite ends of two or more optical fibers toward the first and the second optical devices to form direct board-to-board optical communication between the first and second optical devices.

21. The optical fiber system of claim 20, wherein the positioner is configured to support the optical fibers along a curved path between the opposed optical devices.

22. The optical fiber system of claim 20, wherein the positioner comprises a flexible and resilient support structure that extends along a substantial length of the optical fibers.

23. The optical fiber system of claim 22, wherein the support structure comprises a flexible and resilient ribbon matrix.

24. The optical fiber system of claim 23, wherein the ribbon matrix incorporates an elongated resilient member that increases the resiliency of the ribbon matrix.

25. The optical fiber system of claim 22, wherein the positioner and the optical fibers form a unitary, elongated fiber optic ribbon having a planar surface bounded by two ends and two sides.

26. The optical fiber system of claim 25, wherein the ends of the optical fibers extend beyond the, respective ends of the fiber optic ribbon.

27. The optical fiber system of claim 25, wherein the fiber optic ribbon bends in a plane orthogonal to the planar surface upon application of a compressive force between the ends of the fiber optic ribbon.

28. The optical fiber system of claim 25, wherein the fiber optic ribbon is elastically bendable.

29. The optical fiber system of claim 20, wherein the positioner is configured to hold the optical fibers in a spaced-apart, substantially parallel planar array.

30. The optical fiber system of claim 20, wherein the optical fibers are incorporated in a multi-fiber fiber optic cable and the positioner is configured to releasably receive the multi-fiber fiber optic cable.

31. The optical fiber system of claim 30, wherein the positioner has a support arm configured to guide the optical fibers into alignment with the opposed first and second optical devices.

32. The optical fiber system of claim 31, wherein the support arm includes two or more support fingers.

33. The optical fiber system of claim 32, wherein the positioner includes a second support arm with two or more support fingers that interleave with the support fingers of the first support arm.

34. The optical fiber system of claim 30, wherein the positioner is pivotally coupled to each of the opposed first and second optical devices.

35. The optical fiber system of claim 30, wherein the positioner is characterized by an engaged configuration in which the optical fibers are optically coupled to the opposed first and second optical devices and a disengaged configuration in which the optical fibers are optically de-coupled from the opposed first and second optical devices.

36. The optical fiber system of claim 35, wherein the positioner includes a biasing mechanism configured to switch the positioner between the engaged configuration and the disengaged configuration upon application of a centralized pressing force.

37. The optical fiber system of claim 36, wherein the biasing mechanism includes a spring coupled between the positioner and one of the opposed first and second optical devices.

38. The optical fiber system of claim 20, wherein the positioner is configured to align end portions of the optical fibers in directions oriented at oblique angles relative to respective engagement surfaces of the opposed optical devices.

39. An optical fiber positioner comprising:
  a receiving surface configured to receive a multi-fiber fiber optic cable including two or more optical fibers;
  two supports arms, each configured to pivotally couple to one of two opposed optical devices coupled to facing sides of adjacent and substantially parallel printed circuit boards coupled to a common backplane; and
  at least two support fingers connected to each support arm, the fingers of each arm configured to interleave with the fingers of the other arm when the positioner is in an engaged configuration to urge the optical fibers toward the opposed optical devices and guide the optical fibers into alignment with the optical devices, and to move apart from each other when the positioner is in a disengaged configuration.

40. The positioner of claim 39, further comprising:
  a mechanism operable to switch the positioner between the engaged configuration and the disengaged configuration upon application of a pressing force to the mechanism.

41. The positioner of claim 40, the mechanism further comprising:
  two dual position pistons, each piston mounted to one of the opposed optical devices and including a spring coupled between the positioner and the respective opposed optical device.

42. An optical fiber positioner, comprising:
  a flexible, resilient member having two ends and holding two or more optical fibers in a spaced-apart, substantially planar array, the member elastically bendable into a curved shape in response to a compressive force applied to the ends and having a restoring force that tends to return the member back to an original shape upon release of the compressive force;
  the positioner configured to urge two or more optical fibers toward opposed optical devices coupled to facing sides of adjacent and substantially parallel printed circuit boards coupled to a common backplane, and guide the optical fibers into alignment with the optical device.

43. The positioner of claim 42, wherein the ends of the optical fibers extend beyond the respective ends of the positioner.

44. The positioner of claim 42, wherein the flexible, resilient member is a ribbon matrix.

45. The positioner of claim 44, wherein the ribbon matrix includes an elongated resilient member that increases the resiliency of the ribbon matrix.

* * * * *

UNITED STATES PATENT AND TRADEMARK OFFICE
CERTIFICATE OF CORRECTION

PATENT NO. : 6,580,865 B1
DATED : June 17, 2003
INVENTOR(S) : Schelto Van Doorn

It is certified that error appears in the above-identified patent and that said Letters Patent is hereby corrected as shown below:

Column 8,
Line 24, replace "circuits board" with -- circuit boards --;
Line 57, after "the" delete ",".

Signed and Sealed this

Third Day of February, 2004

JON W. DUDAS
*Acting Director of the United States Patent and Trademark Office*